(12) United States Patent
Curran et al.

(10) Patent No.: US 10,443,145 B2
(45) Date of Patent: Oct. 15, 2019

(54) PROTECTING ANODIZED SURFACES DURING MANUFACTURING PROCESSES

(71) Applicant: Apple Inc., Cupertino, CA (US)

(72) Inventors: James A. Curran, Morgan Hill, CA (US); Aaron D. Paterson, Livermore, CA (US); William D. Burke, Beaverton, OR (US)

(73) Assignee: Apple Inc., Cupertino, CA (US)

( * ) Notice: Subject to any disclaimer, the term of this patent is extended or adjusted under 35 U.S.C. 154(b) by 60 days.

(21) Appl. No.: 15/686,026

(22) Filed: Aug. 24, 2017

(65) Prior Publication Data

US 2019/0062939 A1 Feb. 28, 2019

(51) Int. Cl.
| | |
|---|---|
| *B32B 3/00* | (2006.01) |
| *C25D 11/24* | (2006.01) |
| *H05K 5/00* | (2006.01) |
| *H05K 5/04* | (2006.01) |
| *C25D 11/18* | (2006.01) |
| *C25D 11/22* | (2006.01) |
| *C23C 22/58* | (2006.01) |
| *B44C 1/22* | (2006.01) |
| *G06F 1/16* | (2006.01) |

(52) U.S. Cl.
CPC ............ *C25D 11/246* (2013.01); *C25D 11/18* (2013.01); *C25D 11/22* (2013.01); *C25D 11/243* (2013.01); *H05K 5/0086* (2013.01); *H05K 5/04* (2013.01); *B44C 1/228* (2013.01); *C23C 22/58* (2013.01); *G06F 1/16* (2013.01)

(58) Field of Classification Search
CPC ...... C25D 11/246; H05K 5/04; H05K 5/0086; C23C 22/00
See application file for complete search history.

(56) References Cited

U.S. PATENT DOCUMENTS

| | | | |
|---|---|---|---|
| 2007/0092739 A1 | 4/2007 | Steele et al. | |
| 2007/0188980 A1 | 8/2007 | Hossick-schott | |
| 2011/0284383 A1* | 11/2011 | Cabot | C23C 22/74 205/50 |
| 2016/0160372 A1* | 6/2016 | Cabot | C23C 8/10 205/50 |

FOREIGN PATENT DOCUMENTS

| | | |
|---|---|---|
| WO | 2000/58024 A1 | 10/2000 |
| WO | 2013/155618 A1 | 10/2013 |

* cited by examiner

*Primary Examiner* — Elizabeth E Mulvaney
(74) *Attorney, Agent, or Firm* — Dickinson Wright RLLP

(57) ABSTRACT

Treatments for anodic coatings that provide improved resistance to staining and cracking during various manufacturing processes are described. According to some embodiments, the methods include placing the anodic coatings in partially sealed states by sealing only the outermost portions of the anodic coatings, which protect the outer surfaces of the anodic coatings from contamination and staining. Inner portions of the anodic coatings are left unsealed, thereby making the anodic coatings more compliant and resistant to cracking when exposed to manufacturing processes, even those that involve exposure to high temperatures or high mechanical stress. Subsequent to the processing, another sealing process can be implemented to fully seal the anodic coatings so that they provide good corrosion and wear resistance.

20 Claims, 11 Drawing Sheets

PROTECTING ANODIZED SURFACES DURING MANUFACTURING PROCESSES

FIELD

The described embodiments relate to anodic films and related processes. In particular embodiments, porous anodic films are treated with a partial sealing process that seals the outermost portions of the pores to resist contamination, while remaining portions of the pores are substantially unsealed to provide strain tolerance for further processing.

BACKGROUND

Fully sealed anodic films tend to craze or crack when exposed to high temperatures, such as those induced by laser marking or other thermal treatments during some manufacturing processes. This is due to differential thermal expansion between the anodic film and underlying metal substrate, compounded by the high stiffness of a sealed anodic film. Unsealed anodic films are generally less stiff, and are thus less susceptible to damage from thermal strain induced by such processes as heat treatments or laser marking. However, unsealed anodic films can be vulnerable to staining, discoloration or other cosmetic damage. What is needed, therefore, are methods of protecting anodized parts during manufacturing processes.

SUMMARY

This paper describes various embodiments that relate to treatments for anodic films useful for implementing during production of consumer products, such as consumer electronic devices. According to some embodiments, the anodic films are treated with a partial sealing process to place the anodic films in a protected yet thermally compliant state.

According to one embodiment, a part is described. The part includes an anodic film on a metal substrate. The anodic film has a first section and a second section. The first section is characterized as having a substantially fully sealed pore, and the second section is characterized as having a partially sealed pore.

According to another embodiment, a method of treating a part having an anodic film on a metal substrate is described. The method includes partially sealing the anodic film. The method also includes performing one or more manufacturing operations on the part. The method further includes substantially fully sealing at least a section of the anodic film.

According to a further embodiment, a part is described. The part includes an anodic film integrally bonded to a metal substrate at an interface and having an outer surface opposite the interface. An outermost one micrometer of the anodic film is characterized as having a nickel concentration of at least 20 weight %, and an interior portion of the anodic film between the outermost one micrometer and the interface is characterized as having a nickel concentration of no more than about 5 weight %.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
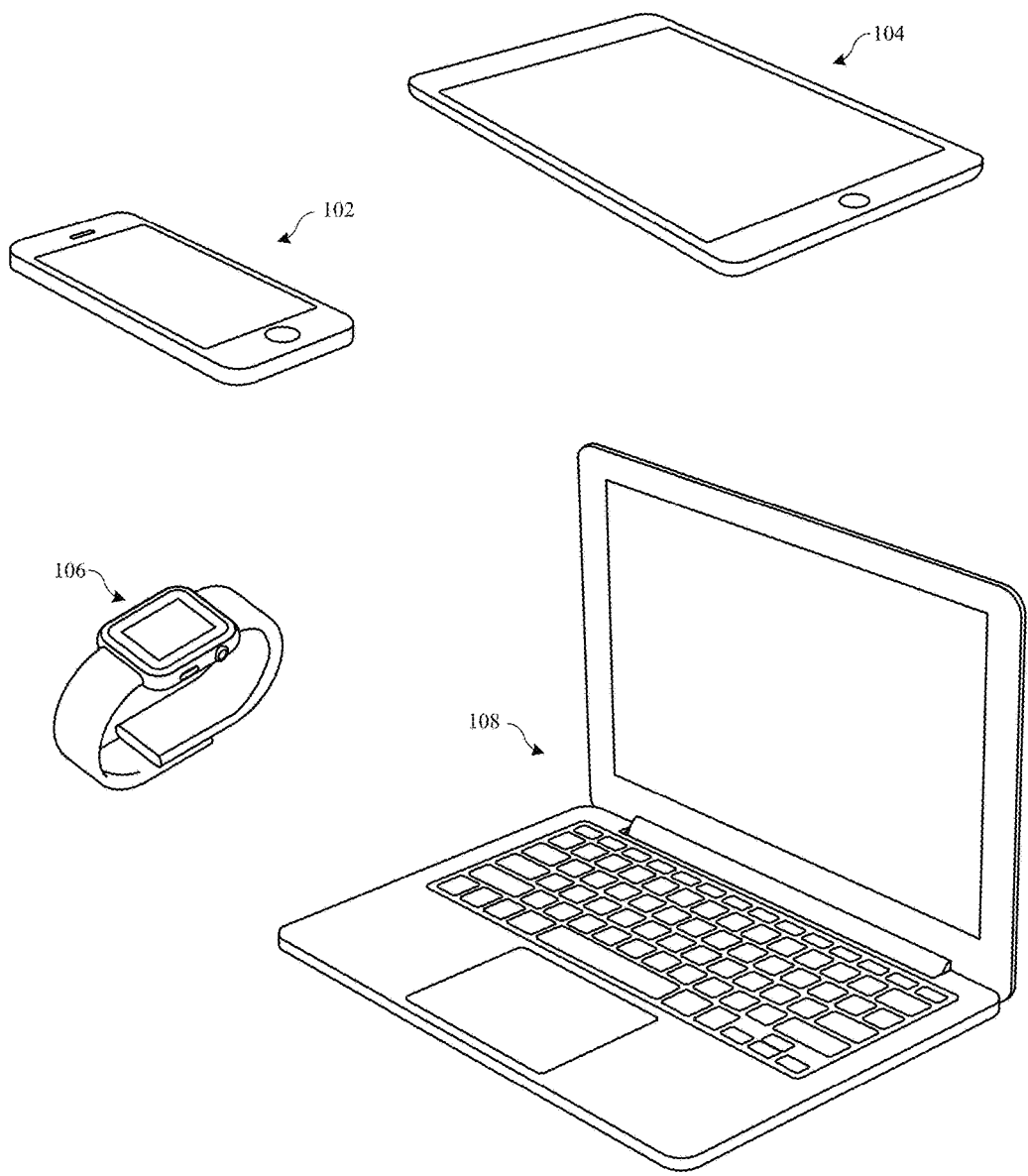
FIG. 1 shows perspective views of devices having metal surfaces that can be manufactured using partial sealing processes described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Methods described herein involve protecting surfaces of anodized parts during manufacturing processes. In some embodiments, the methods involve partially sealing the pores of an anodic film so as to protect the anodic film against staining and other cosmetic damage. Since most of the volume within the pores is left unsealed, the anodic film can retain the elasticity and resilience of an unsealed anodic film. Thus, the anodic film is less susceptible to cracking when put under mechanical or thermal stress. Furthermore, an anodic film in a partially sealed state can be subjected to a wider range of manufacturing processes compared to a fully sealed or unsealed anodic film without causing structural or cosmetic damage to the anodic film. After the manufacturing processes are complete, a full sealing process can be implemented to fully seal the pores.

In some cases, the methods involve using two separate sealing processes—a first sealing process to place the anodic film in a partially sealed state, and a second sealing process to place the anodic film in a fully sealed state. In some embodiments, the first sealing process is a hydrothermal process whereby only the outermost portion of the anodic film is hydrolyzed and sealed, leaving a bulk of the anodic film unsealed. In other embodiments, the first sealing process involves depositing a very thin layer of material, such as a silicate layer, to cover and protect an exterior surface of the anodic film, leaving a bulk of the anodic film unsealed. The second sealing process can involve a hydrothermal process that hydrolyzes and swells the oxide material of the anodic film to a point where the air within the pores is substantially fully replaced with a metal oxide hydroxide material. One or both of the first and second sealing processes can include use of an aqueous solution containing nickel acetate or other catalyst.

When in the partially sealed state, the anodized part can be subjected to one or more manufacturing processes without developing cracks. For example, laser marking or laser etching processes, which may conventionally cause portions of the anodic film near the laser marking or etching area to crack due to thermal stress, can be implemented without substantial cracking. Other thermal processes can include thermal or ultraviolet curing of polymer adhesives, tempering of alloy substrates, hot air-drying processes, and hot injection molding processes. The result can be a substantially crack-free, defect-free and cosmetically pleasing anodized part, suitable for any of a number of consumer products. For example, the methods can be used to form durable and cosmetically appealing finishes for housing of computers, portable electronic devices, wearable electronic devices, and electronic device accessories, such as those manufactured by Apple Inc., based in Cupertino, Calif.

As described herein, the terms oxide, anodic oxide, metal oxide, etc. can be used interchangeably and can refer to any suitable metal oxide materials, unless otherwise specified. Furthermore, the terms coating, layer, film, etc. can be used interchangeably and can refer to any suitable thin layer of material that, for example, covers a surface of a substrate, part, etc., unless otherwise specified. For example, an anodic oxide film can be referred to as an anodic film, anodic coating, anodic oxide coating, anodic oxide layer, metal oxide coating, oxide film, etc. Furthermore, an oxide formed by anodizing a metal substrate will generally be understood to consist of an oxide of the metal substrate. For example, an oxide formed by anodizing an aluminum or aluminum alloy substrate can form a corresponding aluminum oxide film, layer or coating.

These and other embodiments are discussed below with reference to FIGS. 1-9. However, those skilled in the art will readily appreciate that the detailed description given herein with respect to these Figures is for explanatory purposes only and should not be construed as limiting.

The methods described herein can be used to form durable and cosmetically appealing coatings for metallic surfaces of consumer products, such as consumer electronic devices shown in FIG. 1, which includes portable phone 102, tablet computer 104, smart watch 106 and portable computer 108. Electronic devices 102, 104, 106 and 108 can each include housings that are made of metal or have metal sections. Aluminum alloys and other anodizable metals and their alloys are often used due to their ability to anodize and form a protective anodic oxide coating that protects the metal surfaces from scratches. Aluminum alloys, such as 5000 series, 6000 series or 7000 series aluminum alloys, may be choice metal materials due to their light weight and durability.

During manufacturing, the anodized metal portions of devices 102, 104, 106 and 108 can be subjected to any of a number of subsequent thermal processes, such as laser marking processes, thermal cure cycles for adhesives and other polymeric components, or artificial aging of alloy substrates. As described in detail below, these thermal processes can cause small but visible cracks to form within the anodic oxide coatings. Described herein are manufacturing processes for reducing the occurrence of thermal cracking within anodic oxide coatings on devices such as devices 102, 104, 106 and 108.

Figure 2A:
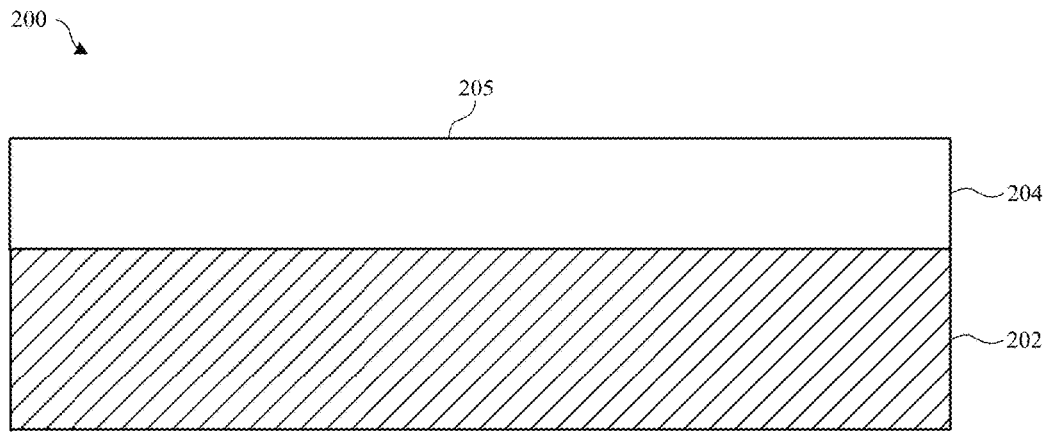
FIGS. 2A and 2B show cross section views of a sealed anodized part prior to and after exposure to a manufacturing process that induces cracks.
Figure 2B:
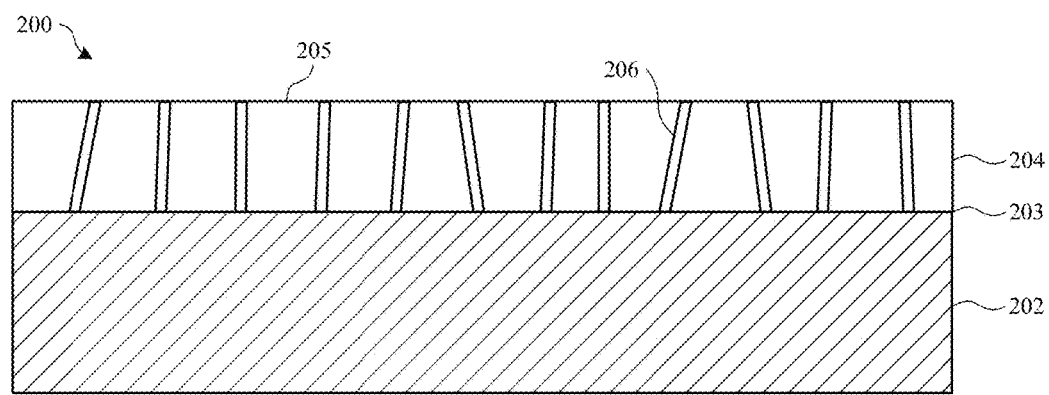

FIGS. 2A and 2B show cross-section views of a surface portion of anodized part 200 before and after a thermal process, respectively. Anodized part 200 includes metal substrate 202 that is coated with anodic film 204. Metal substrate 202 is made of an anodizable material, such as aluminum or aluminum alloy, which can be converted to anodic film 204 using an anodizing process. Type II and type III anodizing processes, as defined by military MIL-A-8625 standard specifications, are widely used to provide anodic oxide coatings with good wear and corrosion resistance on the aluminum and aluminum alloy substrates. The anodizing results in a porous anodic film 204 that has numerous pores formed therein, which correspond to elongated voids having average diameters on the scale of tens of nanometers and that are formed during the anodizing process. For simplicity, these pores are not shown in FIGS. 2A and 2B.

FIG. 2A shows anodized part 200 prior to thermal process. As shown, anodic film 204 does not include visible cracks, and can therefore be referred to as craze-free. In addition, exterior surface 205 of anodic film 204 is continuous and unbroken—i.e., does not have cracks. FIG. 2B shows anodized part 200 after a thermal process whereby anodized part 200 is heated to temperatures of at least about 70 degrees Celsius. Examples of thermal processes can include a laser marking process, adhesive curing, plastic molding operation, hot air drying, and alloy-related heat treatments for metal substrate 202, or any suitable combination thereof.

As shown, the thermal process(es) can form cracks 206 within anodic film 204, which can be visible to a user and breaks the otherwise continuous exterior surface 205 of anodic film 204. Cracks 206 are formed due to differences in material of metal substrate 202 and anodic film 204. In particular, anodic film 204 comprises a metal oxide material while substrate 202 comprises metal. These two types of materials have different thermal expansion coefficients (a), which are measures of how much the materials expand when heated, and are generally measured as a fractional change in size per degree change in temperature at a constant pressure. In general, metal materials expand more when heated compared to metal oxide materials—and therefore metal materials generally have higher thermal expansion coefficients than those of metal oxide materials.

For example, aluminum alloys can have a thermal expansion coefficient of about 22-23 micro-strain per Kelvin, whereas corresponding aluminum oxides can have thermal expansion coefficient of about 5 to 6 micro-strain per Kelvin (i.e., almost 4 times smaller than that of an aluminum alloy). It should be noted that for films and layered materials, it can be useful to define thermal expansion in terms of in-plane thermal expansivity, which can be defined as the change in area (or length) per change in temperature. Thus, due to the differences in thermal expansion coefficients of metal versus metal oxides, metal substrate 202 will have a higher in-plane thermal expansivity than that of anodic film 204. That is, metal substrate 202 will thermally expand (lengthen) more than anodic film 204, causing stress to form within anodic film 204 near interface 203, and ultimately causing cracks 206 to form within anodic film 204 in order to release the stress.

Anodic film 204 is much more susceptible to cracking after anodic film 204 is sealed using a sealing process. A sealing process generally involves exposing anodic film 204 to a hot aqueous solution to hydrolyze the metal oxide material of anodic film 204, thereby filling in the pores with a corresponding metal oxide hydroxide. This rigidifies anodic film 204 and constrains the expansion of anodic film 204 during a subsequent thermal process. In general, cracks 206 cannot be repaired using conventional sealing processes since they are too large. For example, in some instances, these cracks 206 are at least 1000 nanometers wide across or greater.

It should also be noted that cracks 206 can also be formed by non-thermal processes. For example, anodic film 204 can be vulnerable to mechanical stresses brought on by, for example, fixtures used to support or position anodized part 200 during any of a number of manufacturing operations.

Figure 3:
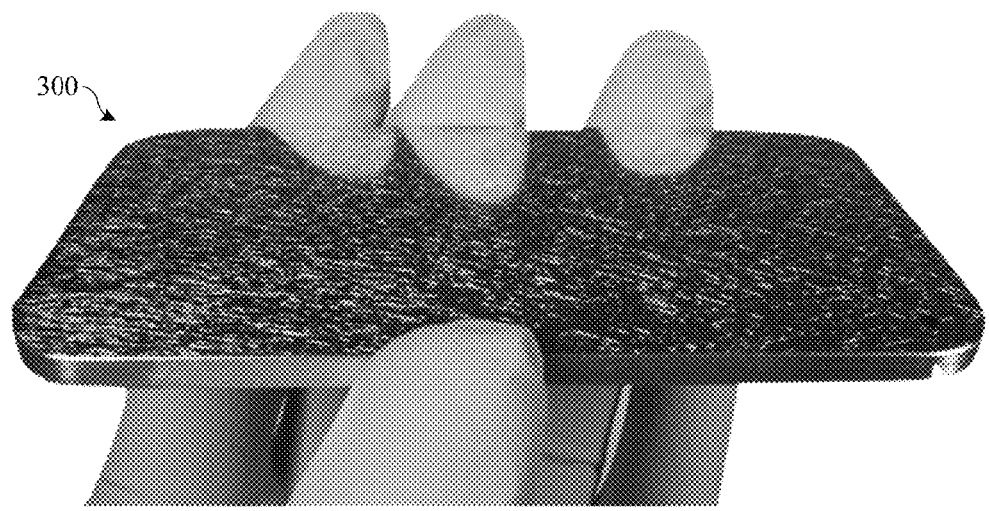
FIG. 3 shows an image of an anodized part with a cracked anodic film.

FIG. 3 shows an image of anodized part 300, which includes an anodic film formed on a mirror-like, lapped aluminum alloy substrate. Anodized part 300 had been subjected to a heat treatment temperature of about 150 degrees Celsius for about 2 hours. In the image of FIG. 3, anodized part 300 is held at such an angle as to reflect a dark background. The visibly light lines on anodized part 300 correspond to thermally induced fine cracks within the otherwise optically clear anodic oxide coating and caused by differential expansion of the anodic film and the metal substrate. Note that the cracks may be more apparent on mirror polished substrates compared to textured substrates (e.g., blasted or etched), although they are present to some degree on all surface finishes. The cracks can be very small (e.g., have widths on the order of about 1 micron). However, contaminants (e.g., water, dirt) can enter these cracks and reach the underlying metal substrate, which can ultimately cause the metal substrate to corrode. Additionally, these cracks can be cosmetically unappealing, especially on consumer products where consumers demand aesthetically pleasing and durable products.

Figure 4A:
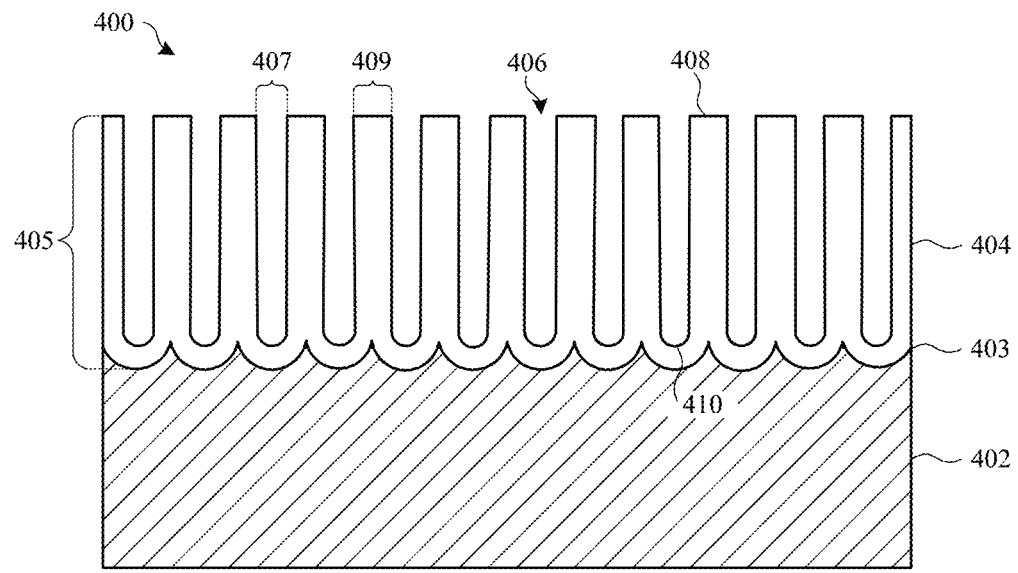
FIGS. 4A-4C show cross section views of anodized part undergoing a treatment that includes a partial sealing process in accordance with some embodiments.
Figure 4B:
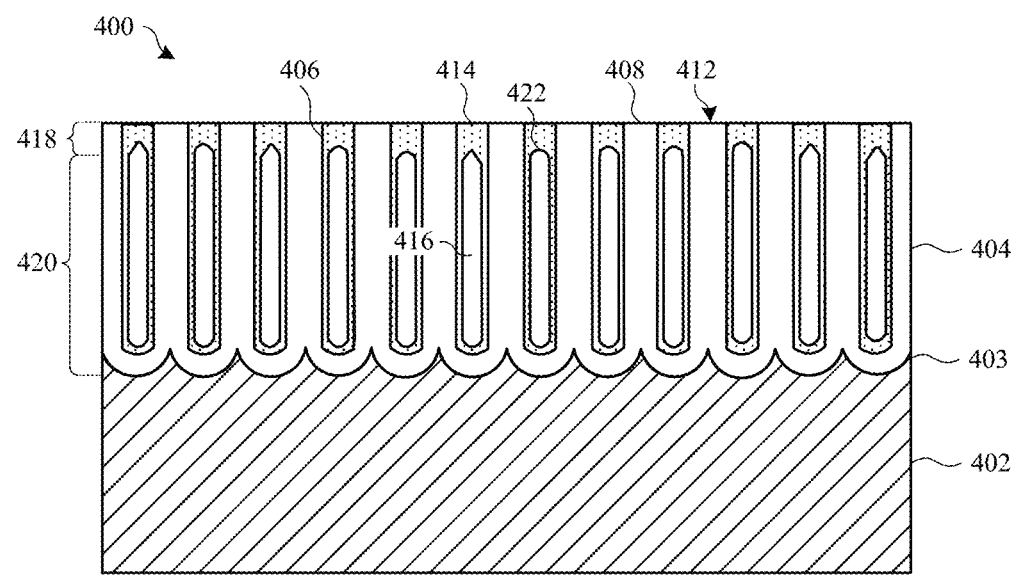
Figure 4C:
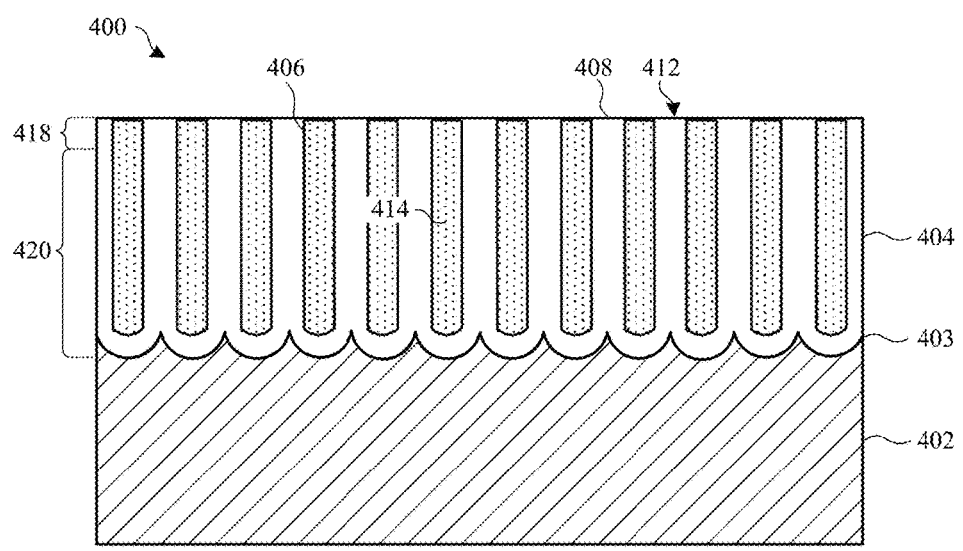

Methods described herein can be implemented to avoid formation of such cracks during the manufacturing process. FIGS. 4A-4C show cross section views of a surface portion of anodized part 400 undergoing a treatment that includes a partial sealing process, in accordance with some embodiments. FIG. 4A shows part 400 after an anodizing process, whereby a portion of metal substrate 402 is converted to a corresponding porous anodic film 404, which includes walls 408 composed of a metal oxide material and defining elongated columnar-shaped pores 406. Any suitable anodizing process can be used. In some embodiments, a type II or type III anodizing processes is used. In some cases, a type II anodizing process is preferred in order to form a relatively transparent yet durable anodic film 404. The shape and size of pores 406, as well as thickness 405 of anodic film 404, will depend on anodizing process conditions as chosen based on design requirements. In some embodiments, diameters 407 of pores 406 will range between about 10 nanometers and about 30 nanometers, and walls 408 will have thicknesses 409 ranging between about 10 and 40 nanometers.

The composition of the metal oxide material of walls 408 will depend, in part, on the composition of metal substrate 402. In some applications, metal substrate 402 is composed of an aluminum alloy, thereby resulting in anodic film 404 composed of an aluminum oxide ($Al_2O_3$) material. Thickness 405 of anodic film 404 can depend on design requirements of particular applications. For example, thickness 405 of between about 5 and 15 micrometers may be suitable for housings for consumer electronic in some cases.

In some embodiments, a colorant (not shown), such as a dye, pigment or metal material, is deposited within pores 406 to impart a desired color to anodic film 404. Any suitable colorant can be used. In some embodiments, the colorant is a dye that adheres to internal surfaces of walls 408, while in some embodiments, the colorant is a metal that is electrodeposited deep within pores 406 (including at terminal ends 410 of pores 406 near interface 403). In some applications, a combination of dyes, pigments, and/or metals is deposited within pores 406.

After anodizing (and after an optional coloring process), anodic film 404 can be highly vulnerable to staining and cosmetic damage because it can have a mesoporous structure (with about 10-11 pores 406 per square centimeter, of about 20 nanometer in diameter 407, of good wettability and very high aspect ratio). Typically, a hydrothermal seal is conducted prior to any further material processing, surface finishing operations, or other types of handling, in order to prevent contaminants from entering and getting trapped within pores 406, and resulting in visible defects. In general, hydrothermal sealing involves hydrating the metal oxide material of walls 408 to a corresponding metal oxide hydroxide. For example, an amorphous alumina ($Al_2O_3$) can be converted to Boehmite (aluminum oxide hydroxide). This hydrolysis causes walls 408 to swell and close the open volume of pores 406. However, fully sealing pores 406 can cause anodic film 404 to have a highly rigid structure that is resistant to deformation when stress is applied, such as the thermal stress associated with certain manufacturing processes described above.

Thus, instead of fully sealing anodic film 404, at FIG. 4B anodic film 404 is partially sealed, wherein the top portions of pores 406 at exterior surface 412 of anodic film 404 are sealed, while leaving a majority volume of pores 406 left unsealed. In particular embodiments, the partial sealing involves a hydrothermal sealing process, where anodic film 404 is exposed to a hot aqueous solution (or steam) for only a short period of time that is sufficient form metal oxide hydroxide 414 at exterior portion 418 whilst leaving interior portion 420 unsealed. As described above, the metal oxide material (e.g., amorphous alumina) of walls 408 is converted to a corresponding metal oxide hydroxide 414 (e.g., Boehmite). The metal oxide hydroxide 414 material bridges the open pores 406 at exterior surface 412, but the hydrolysis is stopped before progressing very far inwards toward interface 403. The walls 408 within interior portion 420 may become hydrolyzed and swell to some extent, however exposure time is limited so as to avoid fully hydrating interior portion 420, thereby leaving voids 416 within pores 406. In this way, exterior portion 418 of partially sealed pores 406 can be said to include metal oxide hydroxide plugs, and interior portion 420 of partially sealed pores 406 includes a non-continuous metal oxide hydroxide structure. Exterior surface 412 can be referred to as being "seared" since it is relatively hard and robust compared to the more compliant unsealed interior portions of anodic film 404.

The extent to which the hydrolysis through the thickness of anodic film 404 will occur depends directly on the exposure time to the hot sealing solution (or steam). In addition, the hot aqueous solution may include a catalyst, such as nickel acetate, which can increase the speed of hydrolysis. In particular embodiments, anodized part 400 is immersed in a hot nickel acetate aqueous solution having a temperature of at least 70 degrees Celsius (typically between 85 and 90 degrees Celsius) for a period of time ranging between about 5 seconds and 3 minutes. In some embodiments, an exposure time period of no more than one minute is found to provide good results. This is compared to the one to two minutes per micrometer exposure time used in conventional sealing (e.g., 15 minutes to one hour long conventional hydrothermal sealing process). In some embodiments, the partial sealing results in seared exterior portion 418 constituting less than about one micrometer of the entire thickness (i.e., from exterior surface 412 to interface 403) of anodic film 404.

Once the partial sealing process is complete, anodized part 400 can be from the hot aqueous solution to stop hydrolysis. In some cases, a drying process can be implemented in order to remove aqueous solution trapped within pores 406. The resultant anodic film 404 can include metal oxide hydroxide 414 having a distinctive inverse cup-shaped structure 422 near exterior surface 412.

While in this partially sealed state, top portions of pores 406 are closed such that contaminants cannot enter the pores 406, thereby making the exterior surface 412 resistant to staining from absorbing dirt or oil. Therefore, anodized part 400 can be transferred between manufacturing stations without incurring contaminant related defects. Nevertheless, anodic film 404 remains almost as compliant and strain tolerant as it was prior to partial sealing. Thus, anodized part 400 can undergo any of a number of mechanically or thermally intensive manufacturing processes without crazing or cracking. It should be noted that even though metal oxide hydroxide 414 sufficiently seals exterior portion 418 to prevent contaminants such as dirt and oil from entering interior portion 420 of pores 406, metal oxide hydroxide 414 at exterior portion 418 can still permeable to aqueous solution so that a subsequent hot aqueous sealing process can fully seal pores 406.

One thermally intensive manufacturing process can include a laser marking process, where a laser is used to form a visibly apparent mark, such as a logo or lettering, on a surface of part 400. For example, a laser beam can be directed at exterior surface 412 and tuned to have a wavelength and a power density that locally heats metal substrate 402 at interface 403 between metal substrate 402 and anodic film 404. The heating locally melts the metal substrate 402 at the interface 403, which can cause local changes in the physical structure of the interface 403 (e.g., changes in roughness, changes in optical reflectivity, etc.), thereby resulting in a visible mark (not shown). In some applications, the laser mark is visibly darker (e.g., black or dark grey) in comparison to surrounding unmarked portions of anodic film 404, while in other applications the laser mark is visibly lighter (e.g., white or light grey) in comparison to unmarked portions. This process can be useful in that an indelible mark can be made on part 400 without significantly interrupting exterior surface 412. One of the consequences of laser marking is localized heating and expansion of metal substrate 402 and anodic film 404 near interface 403. In conventionally fully sealed anodic films, this can cause differential expansion of a metal substrate and an anodic film that result in cracks within the anodic film, as described above. Since pores 406 are only partially sealed, anodic film 404 is allowed to expand and contract at higher temperatures without cracking.

Another thermally intensive operation can include metal alloy heat treatments of metal substrate 402. For example, a post-anodizing heat treatment can be used to diffuse interfacially enriched alloying elements (e.g., zinc) away from interface 403. On some types of aluminum alloys that include relatively large concentrations of zinc, this heat treatment can overcome susceptibility to interfacial adhesion failures and may also be used to change the color of anodized part 400, or to change the temper of metal substrate (e.g., to age-harden an alloy that was anodized in a O, W or T4 temper state). Such post-anodizing heat treatments may be performed on anodized part 400 while in a partially sealed state to help prevent damage to anodic film 404. Details of suitable post-anodizing substrate heat treatments are described in U.S. Pat. No. 9,359,686, issued on Jun. 7, 2016, which is incorporated herein by reference in its entirety.

Other thermally intensive processes can include some drying processes that remove moisture from anodic film 404, bake out processes where hydrogen is removed from anodized part 400, shrink wrapping processes where anodized part 400 is heated during shrink wrapping with a polymer material, molding processes where heated molten material is molded onto surfaces of anodized part 400, thermal cycles for curing adhesives, lacquers, or certain sealing compounds applied to surfaces of anodized part 400, or any other suitable thermal operations.

Some manufacturing process can induce high mechanical strain on anodized part 400. For example, anodized part 400 can be handled by a robot, secured in a fixture, or undergo mild bending for a shaping operation. Some applications involve lapping or polishing of surfaces of anodized part 400. These types of high mechanical stress operations can dent, scratch, or crack a fully sealed anodic film. However, if anodic film 404 is only partially sealed, it will be in a more elastic and resilient state, and will therefore be able to tolerate these types of operations without damage better than a fully sealed anodic film.

It should be noted that a partially sealed anodic film could be accomplished using techniques other than hydrothermal sealing. For example, instead of, or in addition to, a hydrothermal sealing process, a very thin (e.g., less than one micrometer in thickness) silicate layer (not shown) can be applied on exterior surface 412 such that the openings of pores 406 are effectively sealed off while leaving a majority of the volume of pores 406 filled with air and/or colorant. Thus, the silicate layer can prevent contaminants from entering pores 406 while leaving the majority of anodic film 404 stress-tolerant, similar to partial hydrothermal sealing described above. In some manufacturing lines, however, a hydrothermal partial sealing process may be preferable over a silicate partial sealing process since equipment for a hydrothermal sealing process may be more readily accessible and simpler to implement.

After one or more manufacturing processes are performed, at FIG. 4C anodized part 400 can undergo another sealing process that substantially fully seals anodic film 404. In some embodiments, a hydrothermal sealing process is used to hydrolyze walls 408 such that metal oxide hydroxide 414 fills in substantially all remaining voids within pores 406. Any suitable hydrothermal sealing process can be used, including suitable exposure to a hot aqueous solution or steam. Process conditions can vary depending on the thickness of anodic film 404 and other factors. In some embodiments, the hot aqueous solution (or steam) includes a catalyst, such as nickel acetate. In particular embodiments, anodized part 400 is exposed to a hot aqueous solution (e.g., about 85-90 degrees Celsius) for between about 15 minutes to one hour.

As described above, approximately one minute per micrometer of anodic film 404 thicknesses is generally used to provide a complete seal. However, a previous thermal process may affect the amount of time necessary to fully seal anodic film 404. For example, after exposing anodized part 400 to a thermal adhesive curing process, it may be necessary to expose anodized part 400 to a longer full sealing process compared to an anodized part that had not undergone such an adhesive curing process.

In the fully sealed state, anodic film 404 provides high corrosion resistance and wear resistance to metal substrate 402, and thus functions as a highly protective finish during the service life of part 400. The mass loss of a substantially fully sealed anodic film 404 is generally about 15 mg/dm², passing in accordance with ISO 7599-1983(E) standards. One of the ways to characterize whether anodic film 404 has been fully sealed is by measuring the admittance of anodic film 404—i.e., how easily an electric current can flow through anodic film 404. An admittance measurement can also be referred to as an electrical impedance measurement. In general, the more fully sealed anodic film 404 is, the lower the admittance measurement. A fully sealed anodic film 404 having a thickness below about 15 micrometers can have an admittance measurement of less than about 25 micro Siemens (μS). In particular embodiments, an admittance measurement of about 14 μS or less is desirable. In comparison, partially sealed anodic film 404 (FIG. 4B) can have an admittance measurement greater than about 250 us/cm (i.e., at least an order of magnitude greater than a sealed film).

In some embodiments, the aqueous solution used to partially seal anodic film 404 (FIG. 4B) has a different chemical composition that an aqueous solution used to fully seal anodic film (FIG. 4C). For example, an aqueous solution having a nickel acetate catalyst may be used to partially seal anodic film 404, while an aqueous solution without nickel acetate may be used to fully seal anodic film 404. This sequence may be preferred in some cases since the nickel acetate (or other catalyst) can offer maximum pore plugging efficiency at exterior portion 418, with minimal sealing of remaining interior portion 420 of anodic film 404. Likewise, it may be beneficial to perform the subsequent full sealing process in an aqueous solution without nickel acetate (or other catalyst) since sealing of remaining interior portion 420 is desirable.

If a sealing solution includes a catalyst, the resultant anodic film 404 can incorporate readily detectable amounts of the catalyst within the metal oxide hydroxide 414 material. Thus, if the sealing solution for the partial sealing process includes nickel acetate, the resultant metal oxide hydroxide 414 within exterior portion 418 will have trace amounts of nickel. And if the sealing solution for the full sealing process does not include nickel acetate, the resultant metal oxide hydroxide 414 within interior portion 420 will be substantially free of nickel (i.e., no nickel or very low concentrations). Put another way, exterior portion 418 will include a higher concentration of nickel (e.g., between about 20% weight and 35% weight) compared to interior portion 420 (e.g., <1 weight %). A chemical analysis through the thickness (from interface 403 to exterior surface 412) can thus indicate a very high nickel concentration at exterior portion 418 (e.g., top one micrometer of anodic film 404) with a sharp decline of nickel concentration once past exterior portion 418. A graph showing this nickel concentration distribution is described in detail below with reference to FIG. 7.

Figure 5:
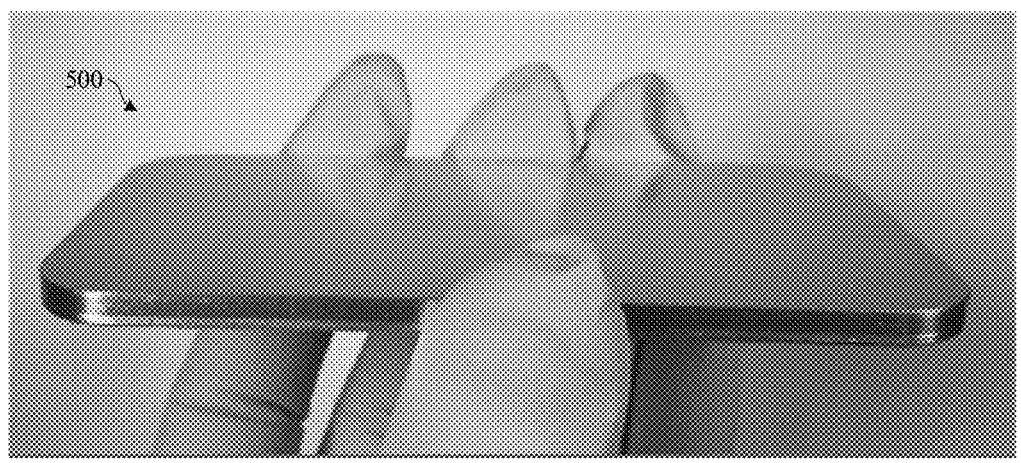
FIG. 5 shows an image of an anodized part treated with a partial sealing operation.

FIG. 5 shows an image of anodized part 500, which includes an anodic film treated with a partial sealing process in accordance with some embodiments. The anodic film is formed on a mirror-like, lapped aluminum alloy substrate, with part 500 held at such an angle as to reflect a dark background. Anodized part 500 was subjected to a heat treatment of about 150 degrees Celsius for about 2 hours while in a partially sealed state, and then fully sealed using a hydrothermal sealing process. As shown, the anodic film of anodized part 500 does not include the highly crazed and visibly cracked appearance of part 300 described above (FIG. 3). In addition, the exterior surface of the anodic film on part 500 is continuous and unbroken.

Figure 6A:
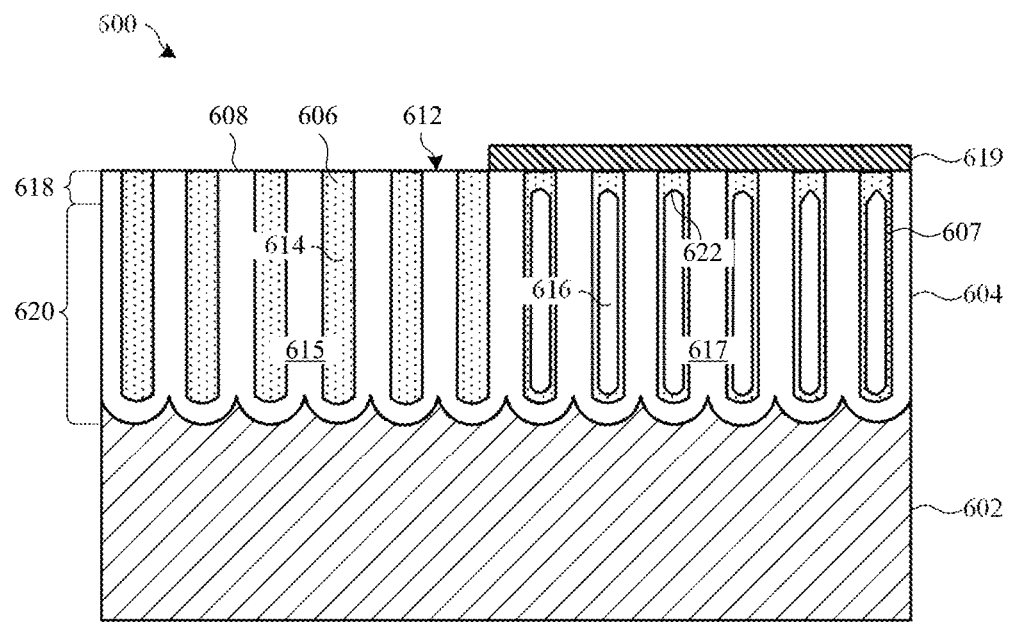
FIGS. 6A-6C show cross section views of an anodized part after undergoing a partial sealing operation and a thermal operation in accordance with some embodiments.
Figure 6B:
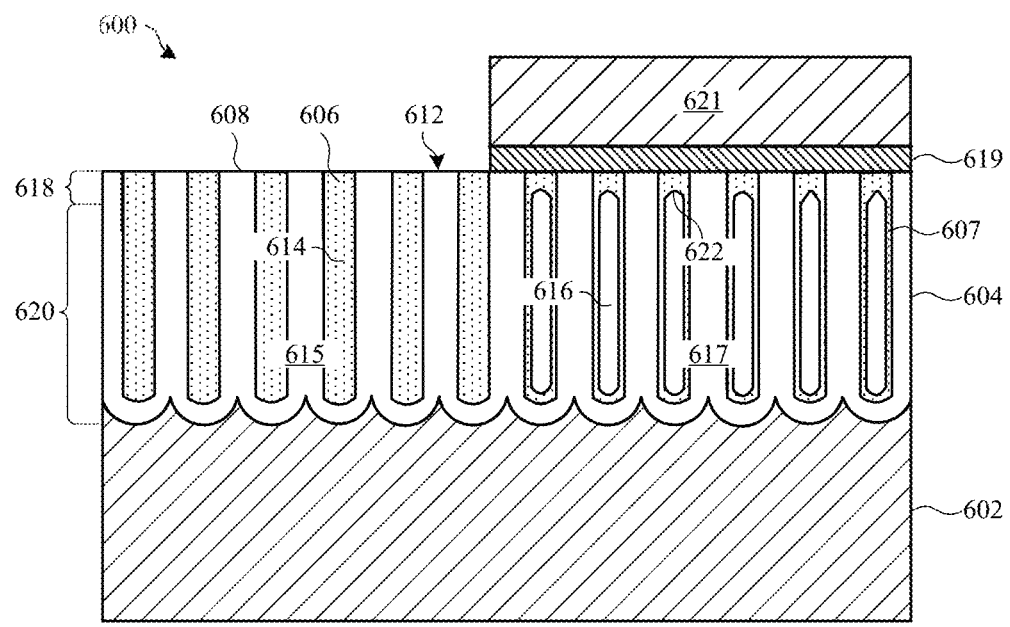

FIGS. 6A and 6B show cross section views of anodized part 600 after undergoing a partial sealing process and polymer curing or molding process, in accordance with some embodiments. Anodized part 600 includes anodic film 604 formed on metal substrate 602. Both first section 615 and adjacent second section 617 of anodized part 600 have undergone a partial sealing process, as described above. In particular, pores 606 within first section 615 and pores 607 within second section 617 have been exposed to a partial hydrothermal sealing process, whereby metal oxide hydroxide 614 material plugs exterior portion 618 of pores 606 and 607.

After the partial sealing process, component 619 is coupled to surface 612 of anodic film 604, thereby blocking entry to pores 607 within second section 617. In some embodiments, component 619 is made of a polymer material that is adhered onto surface 612 of anodic film 604 using a thermal process. In some embodiments, component 619 is a thermosetting type adhesive cured by exposure to heat or light (e.g., ultraviolet light). The type of adhesive and the temperature required to cure the adhesive can vary. For example, some adhesives require exposure to temperatures of about 80 to 100 degrees Celsius, or more. The adhesive is not limited to thermosetting type adhesives. That is, the adhesive can include any suitable synthetic or natural adhesives. In some embodiments, the adhesive includes at least one of elastomer, thermoplastic, emulsion, or thermosetting type adhesives. In particular embodiments, the adhesive includes at least one of epoxy, polyurethane, cyanoacrylate, acrylic, or other suitable polymer adhesive. In some embodiments, multiple layers of adhesive are used. In some applications, the adhesive is non-electrically conducive, while in other applications the adhesive is electrically conductive (e.g., includes electrically conductive material). In some applications, the adhesive includes an optically clear adhesive, which may be used to bond optically transparent structures (e.g., display covers) to an anodized metal housing.

In some applications, component 619 is a polymer that has been molded onto surface 612 by hot injection molding, which can induce both thermal and mechanical strain on anodic film 604. Component 619 can have any suitable shape and size. For example, component can correspond to a very thin part having a thickness of around a few micrometers, or a larger polymer piece having a thickness of several millimeters or centimeters. Since the process for coupling component 619 to surface 612 is performed while anodic film 604 is in a partially sealed state, the risk of thermally or mechanically induced cracking of anodic film 604 is greatly reduced. Thus, anodic film 604 can remain craze-free.

Subsequent to applying component 619, anodized part 600 is exposed to a full hydrothermal sealing process, whereby hot aqueous solution or steam enters pores 606 of first section 615, thereby swelling walls 608 and filling substantially all of the remaining volume of pores 606 with metal oxide hydroxide 614 material. Component 619 prevents entry of the hot aqueous solution or steam from entering pores 607 of second section 617. Thus pores 607 remain only partially sealed, with metal oxide hydroxide 614 material having an inverse cup-shaped structure 622 near surface 612, and a discontinuous metal oxide hydroxide structure (i.e., voids 616) within interior portion 620 of pores 607.

FIG. 6B shows anodized part 600 after second component 621 is optionally placed on first component 619. In some applications where first component 619 is an adhesive, second component 621 is adhered onto first component 619.

In a particular embodiment, first component 619 is an adhesive and second component 621 is a polymer gasket (e.g., O-ring), which cooperate together to form a water-tight seal between anodized part 600 and a surface of another portion of an electronic device. In one embodiment, the water-tight seal is formed around an opening of the enclosure, such as a Subscriber Identity Module (SIM) card tray, a button or switch (e.g., power or volume button), a speaker, a microphone, a camera assembly, etc. In another embodiment, first component 619 is an adhesive and second component 621 is a display cover for a display assembly of an electronic device. First component 619 and second component 621 can correspond to any suitable types of components and are not limited to these particular examples.

One way to detect whether the partial sealing techniques described herein have been used in the manufacture of an anodized part is by taking cross section images of surface portions of the anodized part. For example, transmission electron microscopy (TEM) images may show a visual contrast between pores 606 that are substantially fully filled with metal oxide hydroxide 614 versus pores 607 having voids 616. That is, the presence of voids 616 within pores 607 of second section 617 can be indicative of implementation of a partial sealing process, and that the above-described benefits of having anodic film 604 in a partially sealed state were exploited in order to implement a thermally or mechanically intensive manufacturing process.

Another way to detect the presence of voids 616 within pores 607 is by taking admittance (electrical impedance) measurements of second section 617. In practice, this could be accomplished by removing component 619 (and second component 621, if present) from surface 612 of anodic film 604. In this way, surface 612 at second section 617 can be re-exposed for electrodes to be placed thereon for electrical impedance measurements to be taken. These measurements can be compared to those taken at first section 615. As described above, a fully sealed anodic film (first section 615) will have a much lower admittance measurement than a partially sealed anodic film (second section 617). In some cases, second section 617, which is laterally adjacent to first section 615, is characterized as having an admittance measurement that is at least ten times that of first section 615. In particular embodiments, first section 615 has an admittance measurement of about 25 µS or less. In some embodiments, second section 617 has an admittance measurement greater than about 250 µS.

Figure 6C:
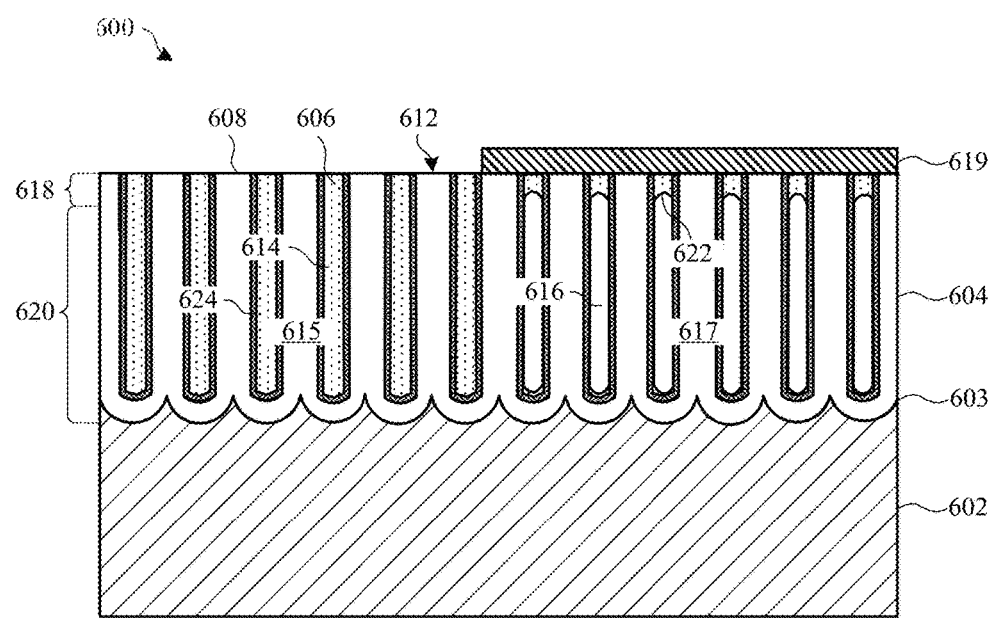

As described above, a colorant, such as a dye, pigment or metal material, can be deposited within that anodic film prior to implementing the partial sealing operation in order to impart a desired color to the anodic film. FIG. 6C shows anodized part 600 that has undergone an optional coloring process, in accordance with some embodiments. Prior to the partial sealing process, colorant 624 is infused within pores 606 and 607. As shown, colorant 624 can adsorb onto internal surfaces of walls 608. After the partial and full sealing processes, colorant 624 remains within pores 606 and 607 and becomes integrated within metal oxide hydroxide 614 material. Voids 616 can still remain within the pores 606 of partially sealed second section 617. It should be noted that the type of colorant and method for infusing the colorant can determine the location of the colorant within pores 606. For example, a colorant 624 composed of organic dyes are often infused by dipping anodic film 604 within a solution of colorant 624. Metal colorants can be deposited deep within pores 606 near interface 603 by electrodeposition techniques. In some cases, multiple types of colorants 624 are used (e.g., organic dyes and metal colorant). Metal colorants can prevent thermally induced cracking of anodic film 604 for different reasons, as described in U.S. patent application Ser. No. 14/971,829, filed Dec. 16, 2015, which is incorporated herein by reference in its entirety.

Figure 7:
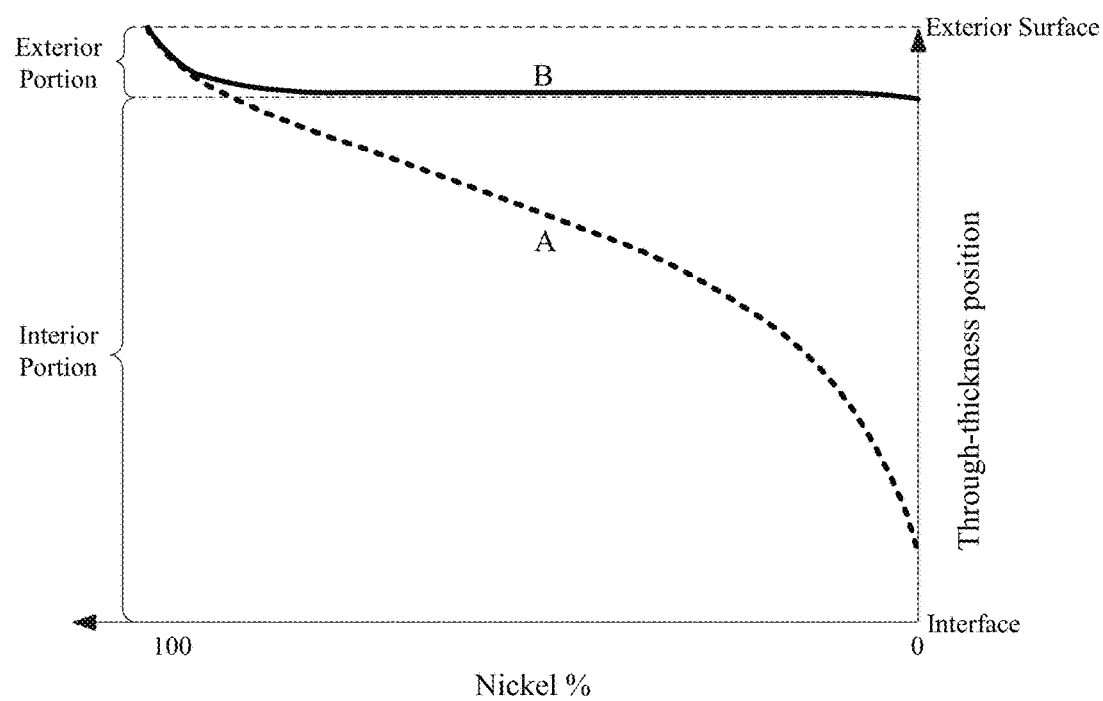
FIG. 7 shows a chart comparing percentages of nickel within anodic films using different hydrothermal sealing processes.

FIG. 7 shows a chart comparing percentages of nickel within anodic films using different thermal sealing processes. The chart of FIG. 7 represents the percentage of nickel (x axis) as a function of through-thickness position (y axis) within two different anodic films A and B. Anodic film A was treated with a sealing process using a hot aqueous solution having nickel (e.g., from a nickel acetate catalyst). Anodic film B was treated with a partial sealing process using a hot aqueous solution having nickel (e.g., from a nickel acetate catalyst), followed by a full sealing process using a hot aqueous solution without nickel.

As shown, both anodic films A and B have relatively high concentrations of nickel within their exterior portions (e.g., corresponding to an outermost 1 micrometer). In some embodiments, the exterior portion of anodic film B is characterized as having a nickel concentration of at least 20% weight). In anodic film A, the nickel concentration declines only gradually toward the interface with the underlying metal substrate, with still significant concentrations of nickel disposed within its interior portion between the exterior portion and the interface. In contrast, the concentration of nickel in anodic film B declines sharply once past its exterior portion (e.g., outermost 1 micrometer), the interior portion having a nickel concentration of no more than about 1 weight %. The graph of FIG. 7 indicates that anodic film B treated with a partial sealing process using a nickel-containing solution followed by a full sealing process using a nickel-free solution can be structurally distinguished from anodic film A treated with a sealing process using a nickel-containing solution. It should be noted that a treatment that includes a partial sealing process and a full sealing process that both contain nickel can give a similar nickel distribution as anodic film A.

Figure 8A:
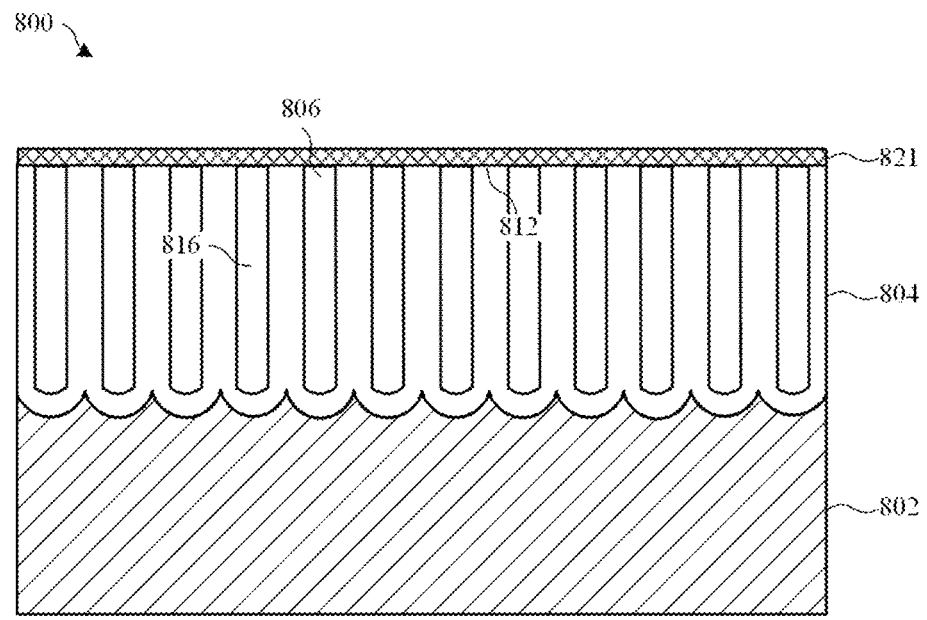
FIGS. 8A and 8B show cross section views of an anodized part undergoing a partial sealing process using a sealing layer in accordance with some embodiments
Figure 8B:
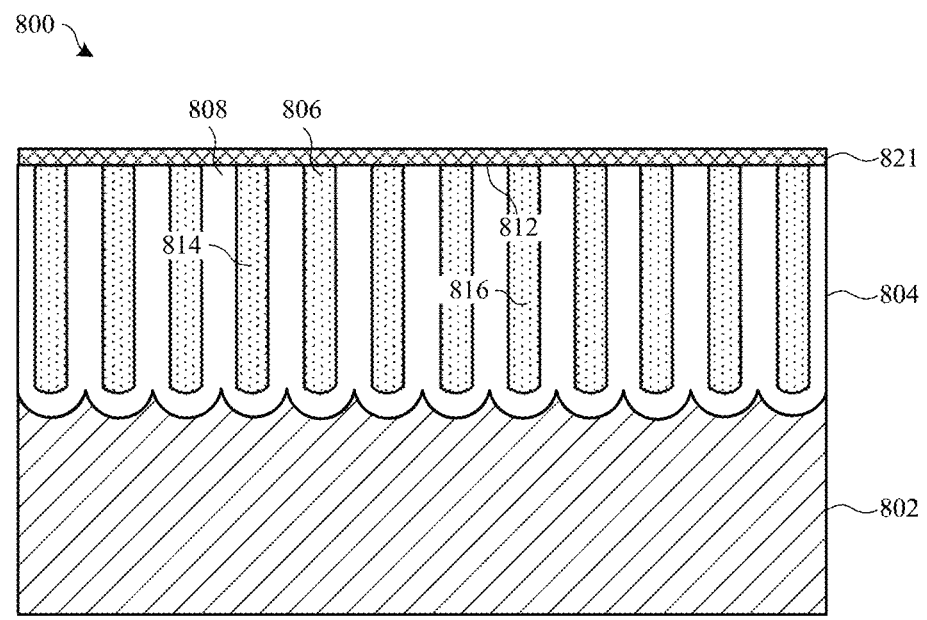

As described above, the partial sealing process is not limited to a hydrothermal sealing process, and may instead involve depositing a thin layer of sealing material. FIGS. 8A and 8B show cross section views of anodized part 800, which includes anodic film 804 on metal substrate 802, undergoing a partial sealing using a sealing layer, in accordance with some embodiments. At FIG. 8A, sealing layer 821 is deposited on exterior surface 812 of anodic film 804, while leaving voids 816 within the bulk of pores 806. Sealing layer 821 can be composed of any suitable material. In some embodiments, sealing layer 821 is composed of a silicate material. In some applications, sealing layer is composed of an optically transparent or translucent material.

Sealing layer 821 should be sufficiently thick to seal the open mouths of pores 806 at exterior surface 812 so as to prevent contaminants from entering pores 806 during one or more manufacturing processes, but may also need to be thin enough to allow solution to enter pores 806 during a subsequent hydrothermal process. In some embodiments, sealing layer 821 is deposited to a thickness ranging between about 0.05 micrometers and about 1 micrometer. In the partially sealed state, anodized part 800 can be subjected to one or more manufacturing processes, such as one or more of the thermally and/or mechanically intensive operations described above. Since the bulk of pores 806 are filled with air, anodic film 404 is more compliant and able to withstand higher thermal and mechanical strain compared to a fully sealed anodic film.

At FIG. 8B, anodized part 800 is exposed to a hydrothermal sealing process to fully seal pores 806. Walls 808 of anodic film 804 are hydrolyzed to form metal oxide hydroxide 814 that substantially fully fills pores 806. In this fully sealed state, anodic film 804 is sufficiently hard to adequately protect metal substrate 802 from scratching during the service life of anodized part 800. If sealing layer 821 is transparent, its presence can be virtually undetectable to a user. However, sealing layer 821 can be detected using chemical analysis techniques, such as the chemical analysis techniques described above with respect to detecting the concentration of nickel. In general, the outermost portion of the combined thickness of anodic film 804 and sealing layer 821 will have a higher concentration of silicon than the inner portion. For example, a through-thickness chemical analysis of the combined thickness of anodic film 804 and sealing layer 821 can indicate a strong presence of silicon within the outermost one micrometer and substantially no silicon (i.e., free of silicon) past the one micrometer mark.

Figure 9:
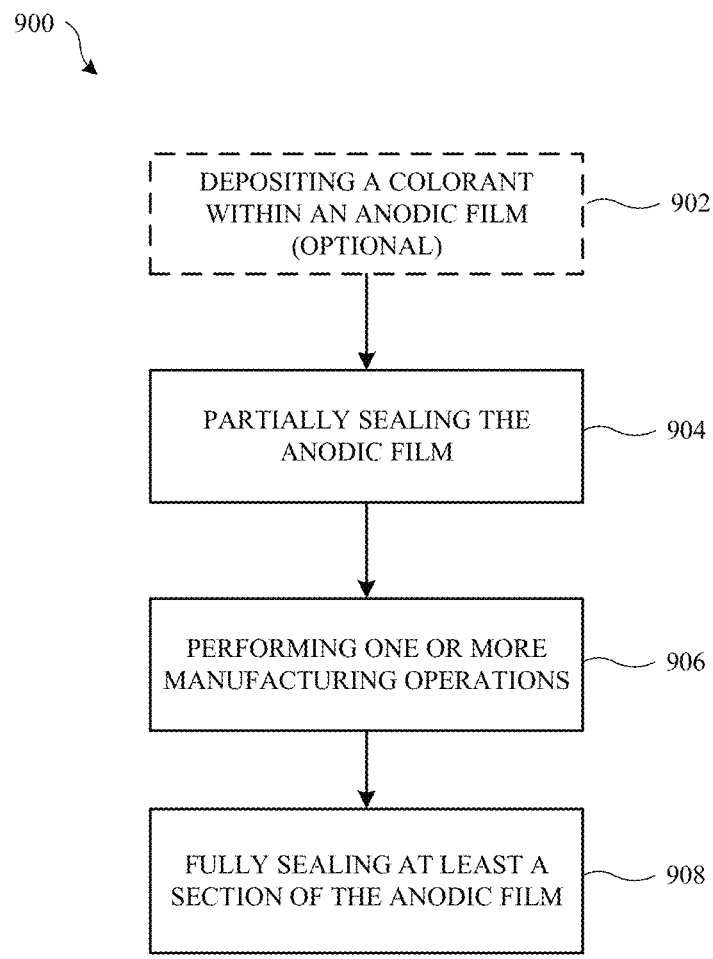
FIG. 9 shows a flowchart indicating an anodic film treatment process that includes a partial sealing in accordance with some embodiments.

FIG. 9 shows flowchart 900 indicating an anodic film treatment process that includes a partial sealing, in accordance with some embodiments. At 902, a colorant is optionally deposited within the anodic film. In some embodiments, the colorant is a dye that is deposited within the pores by immersing that anodized part in a solution containing the dye such that the dye diffuses within the pores and adsorbs onto internal surfaces of the pore walls. In some embodiments, the colorant is a metal-containing colorant that is electrodeposited within the pores. In some embodiments, the colorant includes a combination of dye and metal-containing colorant.

At 904, the anodic film is partially sealed such that exterior portions of the pores are sufficiently sealed to prevent contaminants from entering the pores during a subsequent manufacturing process. Interior portions of the pores can have air filled voids such that the anodic film is more resistant to cracking when placed under thermal and mechanical strain. In some embodiments, the partial sealing process involves a hydrothermal sealing process, whereby the exterior portions of the pore wall are hydrated and swelled closed. In some embodiments, the partial sealing process involves depositing a very thin sealing layer (e.g., silicate layer) on an exterior surface of the anodic film.

While in the partial sealed state, at 906 one or more thermally and/or mechanically intensive operations are performed on the anodized part. The one or more operations can include, but are not limited to, laser marking, thermal or ultraviolet curing of polymer adhesives, artificial ageing or tempering of alloy substrates, high air-drying processes, molten polymer injection molding, and anodic film polishing or lapping. In general, the anodic film in the partially sealed state can tolerate higher temperatures and more mechanical strain without cracking compared to a fully sealed anodic film. In some embodiments, one or more components (e.g., adhesive layers) are adhered to one or more sections of the anodic film prior to a subsequent full sealing process.

At 908, at least one section of the anodic film is fully sealed using, for example, a hydrothermal sealing process that fully closes voids within the pores. When in the fully sealed state, spaces within the anodic film are filled with metal oxide hydroxide material such a that water cannot easily pass through the anodic film to reach the underlying metal substrate. In this way, the fully sealed anodic film provides a good corrosion barrier to the metal substrate.

In embodiments where one or more components (e.g., adhesive layers) are adhered to the anodic film, the section(s) of the anodic film covered by the component(s) can be shielded from exposure to the sealing solution. Thus, these section(s) can remain in the partially sealed state. These partially sealed sections of the anodic film can be detected using one or more of the techniques described above.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

The invention claimed is:

1. A part, comprising:
an anodic film overlaying a metal substrate, the anodic film having a first section and a second section,
wherein the first section is characterized as having a substantially fully sealed pore such that the first section has an electrical impedance measurement of about 30 µS or less, and the second section is characterized as having a partially sealed pore.

2. The part of claim 1, wherein a polymer is adhered to a surface of the second section.

3. The part of claim 1, wherein the first section is laterally adjacent to the second section.

4. The part of claim 1, wherein the second section is characterized as having an electrical impedance measurement that is at least ten times that of the first section.

5. The part of claim 1, wherein the substantially fully sealed pore has a colorant infused therein.

6. The part of claim 1, wherein the partially sealed and the substantially fully sealed pores are characterized as having diameters ranging between about 10 nanometers to about 30 nanometers.

7. The part of claim 1, wherein the substantially fully sealed and the partially sealed pores include a sealant material.

8. The part of claim 1, wherein an outer section of the partially sealed pore includes a metal oxide hydroxide plug, and an interior section of the partially sealed pore includes a non-continuous metal oxide hydroxide structure.

9. The part of claim 7, wherein the sealant material includes nickel.

10. A method of treating a part having an anodic layer that overlays a metal substrate, the method comprising:
partially sealing pores of the anodic layer;
exposing the anodic layer to thermal energy by performing one or more manufacturing operations on the part; and
subsequent to exposing the anodic layer to the thermal energy, fully sealing at least some of the pores of the anodic layer.

11. The method of claim 10, wherein the pores define an interior volume, and the pores are partially sealed with a sealant material.

12. The method of claim 11, wherein the pores are partially sealed when a minority of the interior volume includes the sealant material.

13. The method of claim 10, wherein the one or more manufacturing operations include a laser marking process, a thermal cure cycle, or an artificial aging process.

14. The method of claim 13, wherein partially sealing the pores of the anodic layer prevents cracks from forming within the anodic layer when the anodic layer is exposed to the thermal energy.

15. The method of claim 14, wherein the cracks form within the anodic layer due to a difference in coefficients of thermal expansion between the anodic layer and the metal substrate.

16. The method of claim 10, wherein partially sealing the pores of the anodic layer includes applying a silicate layer on an exterior surface of the anodic layer, wherein fully sealing the pores of the anodic layer includes using a hydrothermal sealing process.

17. A part, comprising:
 an anodic layer formed from a metal substrate and having pores that (i) extend towards the metal substrate, and (ii) include a sealant material, wherein an outer region of the anodic layer is characterized as having a concentration of the sealant material that is at least 20 weight % or greater, and an interior region of the anodic layer is characterized as having a concentration of the sealant material that is no more than about 1 weight %.

18. The part of claim 17, wherein the anodized part includes a first section and a second section, wherein the first section is characterized as having a substantially fully sealed pore, and the second section is characterized as having a partially sealed pore.

19. The part of claim 18, wherein the second section is characterized as having an electrical impedance that is at least ten times that of the first section.

20. The part of claim 17, wherein the sealant material includes nickel.

* * * * *

UNITED STATES PATENT AND TRADEMARK OFFICE
CERTIFICATE OF CORRECTION

PATENT NO. : 10,443,145 B2
APPLICATION NO. : 15/686026
DATED : October 15, 2019
INVENTOR(S) : James A. Curran, Aaron D. Paterson and William D. Burke Page 1 of 1

It is certified that error appears in the above-identified patent and that said Letters Patent is hereby corrected as shown below:

In the Claims

Column 14, Line 25 (Claim 1, Line 6) - "has an electrical impedance measurement of" should read -- has an electrical measurement of --.

Column 14, Line 33 (Claim 4, Line 2) - "characterized as having an electrical impedance measurement that" should read -- characterized as having an electrical measurement that --.

Column 15, Line 29 (Claim 19, Line 2) - "characterized as having an electrical impedance that" should read -- characterized as having an electrical admittance measurement that --.

Signed and Sealed this
Twenty-sixth Day of November, 2019

Andrei Iancu
*Director of the United States Patent and Trademark Office*